US006867531B2

(12) United States Patent
Rueger et al.

(10) Patent No.: US 6,867,531 B2
(45) Date of Patent: Mar. 15, 2005

(54) METHOD OF CALCULATING THE VOLTAGE SETPOINT OF A PIEZOELECTRIC ELEMENT

(75) Inventors: Johannes-Joerg Rueger, Vienna (AT); Udo Schulz, Vaihingen/Enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/292,112

(22) Filed: Nov. 11, 2002

(65) Prior Publication Data

US 2003/0111934 A1 Jun. 19, 2003

(30) Foreign Application Priority Data

Nov. 10, 2001 (DE) ........................................ 101 55 389

(51) Int. Cl.[7] ........................ H01L 41/113; F02M 51/06

(52) U.S. Cl. ........................ 310/317; 123/478; 123/498

(58) Field of Search ................................ 310/314, 315, 310/317; 123/375, 457, 458, 463, 464, 479, 490, 498

(56) References Cited

U.S. PATENT DOCUMENTS 3,827,409 A * 8/1974 O'Neill ...................... 123/458
4,944,271 A * 7/1990 Iwata et al. ............ 123/406.41
5,299,868 A * 4/1994 Dennis et al. .............. 374/117
5,367,999 A * 11/1994 King et al. ................. 123/458
5,731,742 A * 3/1998 Wojewoda et al. ........... 331/44
5,758,309 A * 5/1998 Satoh ......................... 701/108
5,771,861 A * 6/1998 Musser et al. .............. 123/357
6,047,682 A * 4/2000 Fujino et al. ............... 123/458
6,499,464 B2 * 12/2002 Rueger ....................... 123/446
6,597,083 B2 * 7/2003 Gallmeyer et al. ......... 310/315
6,603,364 B2 * 8/2003 Nemoto ....................... 331/66
6,619,268 B2 * 9/2003 Rueger et al. .............. 123/490

* cited by examiner

*Primary Examiner*—Thomas M. Dougherty
(74) *Attorney, Agent, or Firm*—Kenyon & Kenyon

(57) ABSTRACT

A method of calculating the voltage setpoint of a piezoelectric element as a function of a rail pressure is provided, in which a corrected voltage setpoint is formed by, among other adjustments, using a multiplier as a function of a temperature of the piezoelectric element. Additional adjustments for forming the corrected voltage setpoint includes adjusting the setpoint control voltage by multiplication by at least one correction value (multiplier) and/or by addition of at least one correction value (addend).

4 Claims, 2 Drawing Sheets

METHOD OF CALCULATING THE VOLTAGE SETPOINT OF A PIEZOELECTRIC ELEMENT

FIELD OF THE INVENTION

The present invention relates to a method of calculating the voltage setpoint of a piezoelectric element as a function of the rail pressure.

BACKGROUND INFORMATION

Among other things, piezoelectric elements are used in fuel injectors for internal combustion engines. If, for example, the piezoelectric element is used as an actuator in a fuel injection system, it is necessary for certain applications that the piezoelectric element be able to be brought to different expansions or if needed to varying expansions as precisely as possible. Through direct or indirect transmission to a control valve, different expansions of the piezoelectric element correspond to the displacement of an actuator, like a nozzle needle for example. The displacement of the nozzle needle results in the opening of injection orifices. The duration of the opening of the injection orifices corresponds to a desired injected fuel quantity as a function of a free cross section of the orifices and an applied pressure.

The transmission of the expansion of the piezoelectric element to the control valve is differentiated here into two basic transmission modes. In the first, direct, transmission mode, the nozzle needle is moved directly by the piezoelectric element via a hydraulic coupler. In the second transmission mode, the movement of the nozzle needle is controlled by a control valve which is triggered by the piezoelectric element via a hydraulic coupler. The hydraulic coupler has two characteristics: first, the reinforcement of the stroke of the piezoelectric element, and second, the decoupling of the movement of the control valve and/or the nozzle needle from a static thermal expansion of the piezoelectric element.

High pressure, which is generated in a pressure chamber, also referred to as a rail, by a high pressure fuel pump for example, prevails inside the control valve. The pressure generated by this high pressure fuel pump is referred to as rail pressure. In order to position the control valve accurately and thus implement a desired injection, a control voltage setpoint is required for the piezoelectric element. This control voltage setpoint is formed as a function of pressure. This voltage setpoint is additionally corrected as a function of a temperature of the piezoelectric element by using a multiplier.

However, in this method the control voltage characteristic curve determined is not applicable equally to all piezoelectric elements and all injectors. The reasons for the deviations occurring here lie first in the scattering of the stroke capability of the piezoelectric elements, and second in the mechanical tolerances of the injector components. The calculation of the voltage setpoint for determining the control voltage characteristic curve is not possible with the present method, due to specific correction values of the piezoelectric elements and/or the injectors which have not been taken into account.

SUMMARY OF THE INVENTION

The method of calculating the voltage setpoint according to the present invention provides that the corrected voltage setpoint to be calculated is formed by multiplication of the voltage setpoint by at least one correction value (multiplier)

and/or by addition with at least one correction value (addend). The multiplier and/or the addend contain the specific data of the piezoelectric element and the injector. Hereby it may be allowed to adapt the control characteristic curves as a function of the rail pressure, the temperature of the piezoelectric element, the specifics of the piezoelectric element used, and the specific data of the injector. Thus tolerances within the control voltage characteristic curves may be drastically reduced and the method may be performed via data feed within an engine controller individually, at a vehicle manufacturer, for example, adjusted to the piezoelectric elements and injectors used. This method is thus also practicable for large-scale production.

DETAILED DESCRIPTION

Figure 1:
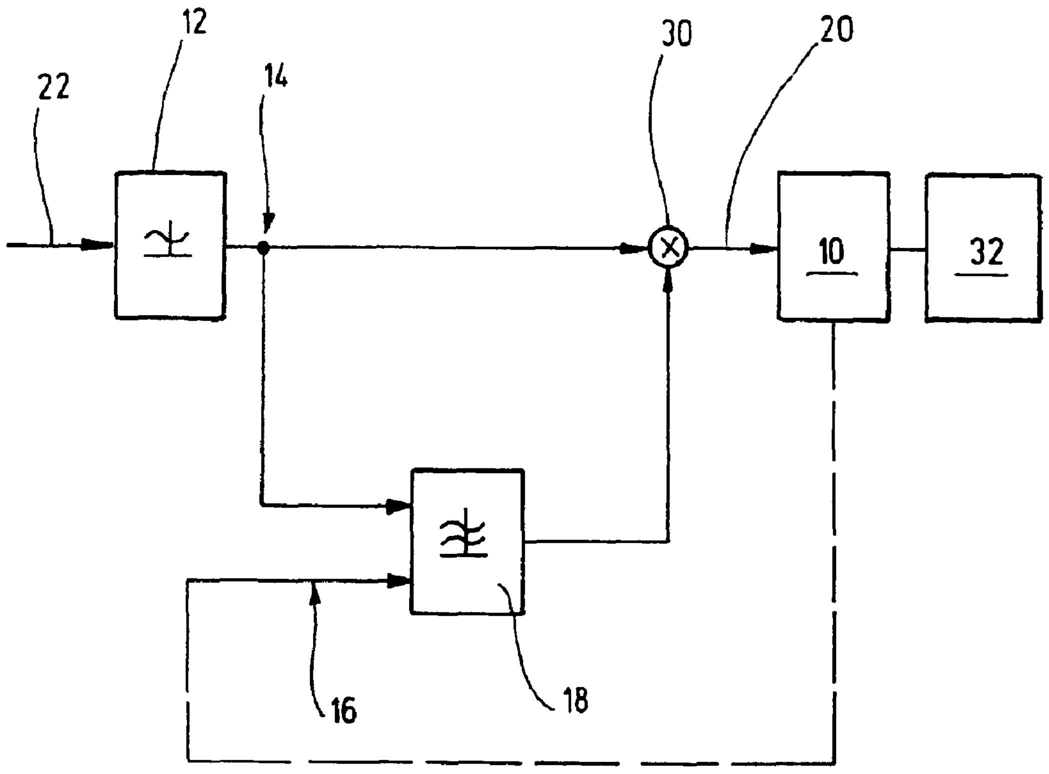
FIG. 1 shows a block diagram of a setpoint calculation including correction of a voltage setpoint as a function of a rail pressure and a temperature of a piezoelectric element.

In a block diagram, FIG. 1 shows a method of setpoint calculation including correction of a setpoint control voltage 14 as a function of rail pressure 22 and as a function of a temperature 16 of piezoelectric element 10. For piezoelectric elements 10 used previously and for injectors 32 used in conventional injection systems, control voltage characteristic curves 12 are determined as a function of rail pressure 22. Control voltage characteristic curves 12 at which a control valve works against rail pressure 22 after deflection by piezoelectric element 10 are determined, and also control voltage characteristic curves 12 are determined at which the control valve is moved with rail pressure 22 after return of the deflection of piezoelectric element 10. These control voltage characteristic curves 12 each represent setpoint control voltages 14. Since piezoelectric element 10 has a static thermal expansion, a correction is performed as a function of temperature 16 of piezoelectric element 10 and temperature-corrected control voltage characteristic curves 18 are determined. A correction value, multiplier 30, using which setpoint control voltages 14 are corrected, results from control voltage characteristic curves 12 and control voltage characteristic curves 18. Temperature-corrected setpoint control voltages 20 with which piezoelectric element 10 and subsequently injector 32 are controlled are thus obtained.

Figure 2:
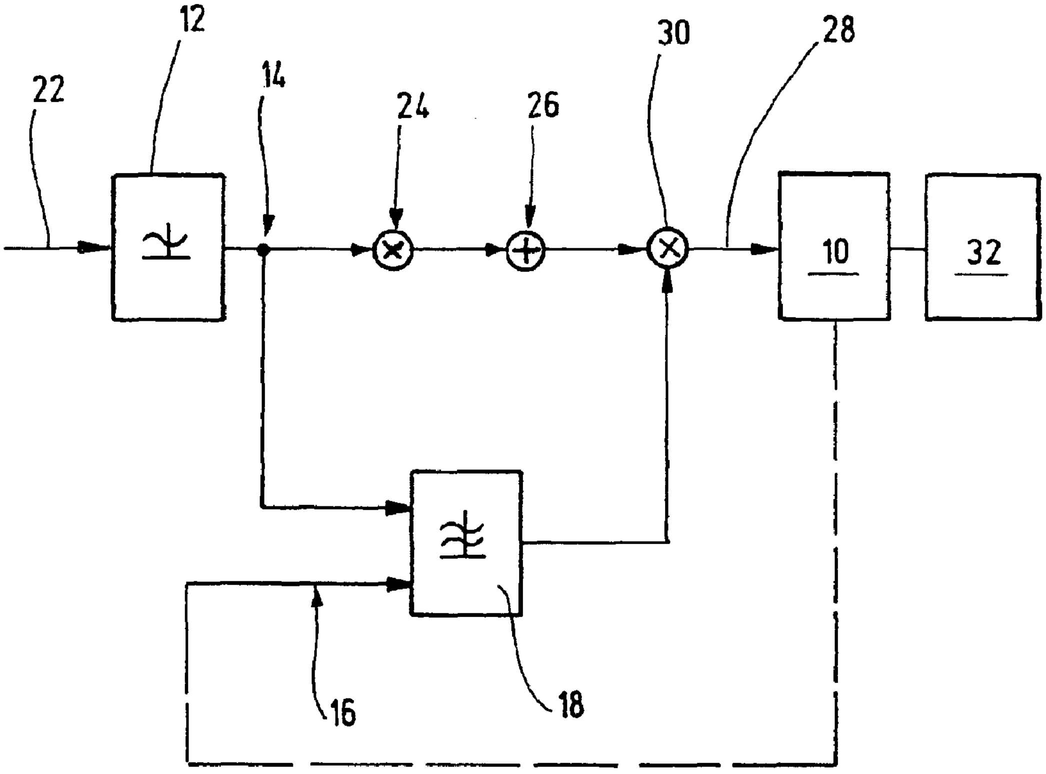
FIG. 2 shows a block diagram for setpoint calculation including correction of the voltage setpoint as a function of rail pressure, the temperature of the piezoelectric element, and the correction of the voltage setpoint using specific data from the piezoelectric element and an injector.

According to the present invention, FIG. 2 shows a block diagram of the method of setpoint calculation including correction of setpoint control voltage 14 as a function of rail pressure 22, temperature 16 of piezoelectric element 10, as described earlier in FIG. 1, a specific correction value 24 of piezoelectric element 10, and a specific correction value 26 of injector 32. Here again, control voltage characteristic curves 12 for piezoelectric elements 10, which work with or against rail pressure 22, are determined. Dependency on rail pressure is taken into account for determining control voltage characteristic curves 12 and, for determining control voltage characteristic curves 18, the static temperature dependency of piezoelectric element 10 is included. As described earlier, these control voltage characteristic curves 12 and 18 so determined result in multiplicative correction value 30. In reference to FIG. 1, setpoint control voltage 14 is additionally modified by using a multiplier as correction value 24 which contains the specific data of a piezoelectric element 10. In addition, a correction value 26 is added which contains the injector-specific data of an injector 32.

After correction of the rail pressure-dependent setpoint control voltages 14 by multiplication using correction value 24, by addition of correction value 26, and a final correction by yet another multiplication using correction value 30, the result is corrected setpoint control voltage 28, by use of which piezoelectric element 10 is controlled.

What is claimed is:

1. A method of adjusting a setpoint control voltage for controlling a piezoelectric element in a fuel injector, comprising:

adjusting the setpoint control voltage as a function of a rail pressure;

adjusting the setpoint control voltage further by at least one of multiplication with at a first correction multiplier value and addition of at least one correction addend value; and adjusting the setpoint control voltage further as a function of a temperature of the piezoelectric element by using a second correction multiplier;

wherein a corrected setpoint control voltage is formed from the adjustments.

2. The method of claim 1, wherein first correction multiplier value is derived based on characteristic data regarding the piezoelectric element and the at least one correction addend value is derived based on characteristic data regarding the fuel injector.

3. The method of claim 1, wherein second correction multiplier value is derived based on a first control voltage characteristic curve at least partially representing temperature dependence of the piezoelectric element and a second control voltage characteristic curve at least partially representing dependence on the rail pressure.

4. The method of claim 1, wherein the step of adjusting using the first correction multiplier and the correction addend value is performed before the step of adjusting as a function of the temperature of the piezoelectric element.

* * * * *